United States Patent
Chae

(10) Patent No.: US 9,552,857 B1
(45) Date of Patent: Jan. 24, 2017

(54) ADDRESS GENERATION CIRCUIT AND SEMICONDUCTOR MEMORY DEVICE INCLUDING THE SAME

(71) Applicant: SK hynix Inc., Gyeonggi-do (KR)

(72) Inventor: Kyeong-Min Chae, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 0 days.

(21) Appl. No.: 15/210,737

(22) Filed: Jul. 14, 2016

(30) Foreign Application Priority Data

Mar. 4, 2016 (KR) .................. 10-2016-0026358

(51) Int. Cl.
| | | |
|---|---|---|
| G11C 29/00 | (2006.01) | |
| G11C 8/18 | (2006.01) | |
| G11C 8/04 | (2006.01) | |
| G11C 8/20 | (2006.01) | |
| G11C 8/06 | (2006.01) | |

(52) U.S. Cl.
CPC . *G11C 8/18* (2013.01); *G11C 8/04* (2013.01); *G11C 8/06* (2013.01); *G11C 8/20* (2013.01)

(58) Field of Classification Search
USPC ..................................... 365/200, 233.1, 236
See application file for complete search history.

(56) References Cited

U.S. PATENT DOCUMENTS

2007/0081402 A1* 4/2007 Park .................. G11C 29/842
365/200

FOREIGN PATENT DOCUMENTS

KR 1020050011923 1/2005

* cited by examiner

*Primary Examiner* — Vu Le
(74) *Attorney, Agent, or Firm* — IP & T Group LLP

(57) ABSTRACT

An address generation circuit includes: a first address control clock generation unit suitable for generating a first address control clock signal in response to an internal clock signal; a second address control clock generation unit suitable for generating a second address control clock signal in response to one of an address initialization signal and the first address control clock signal; an address counting unit suitable for counting the second address control clock signal and generating a counting address; and a repair control unit suitable for latching the counting address in response to the second address control clock signal, comparing the latched counting address with a repair address, and generating a redundancy address based on the comparison result.

18 Claims, 9 Drawing Sheets

FIG. 2
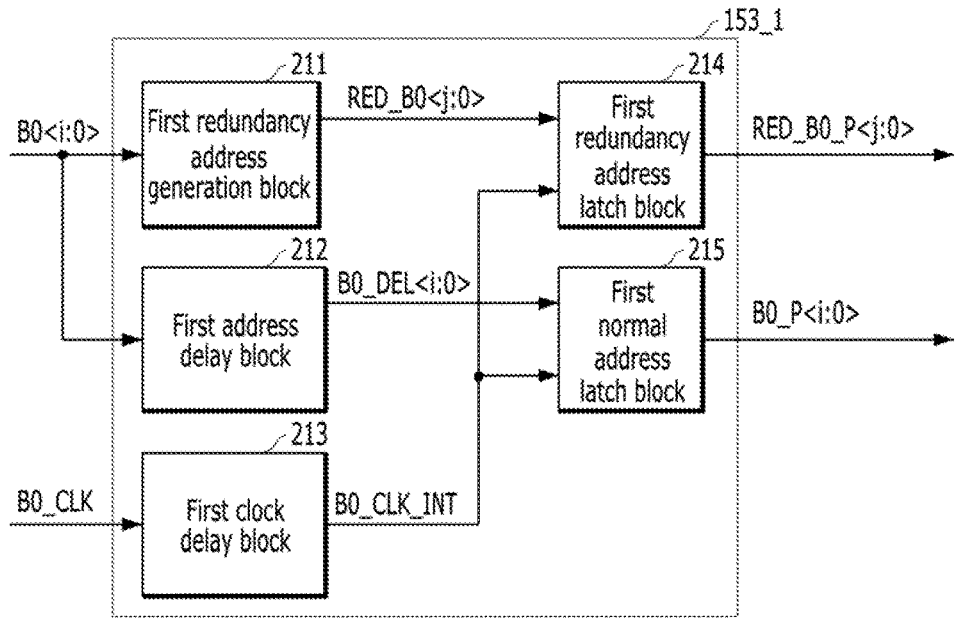
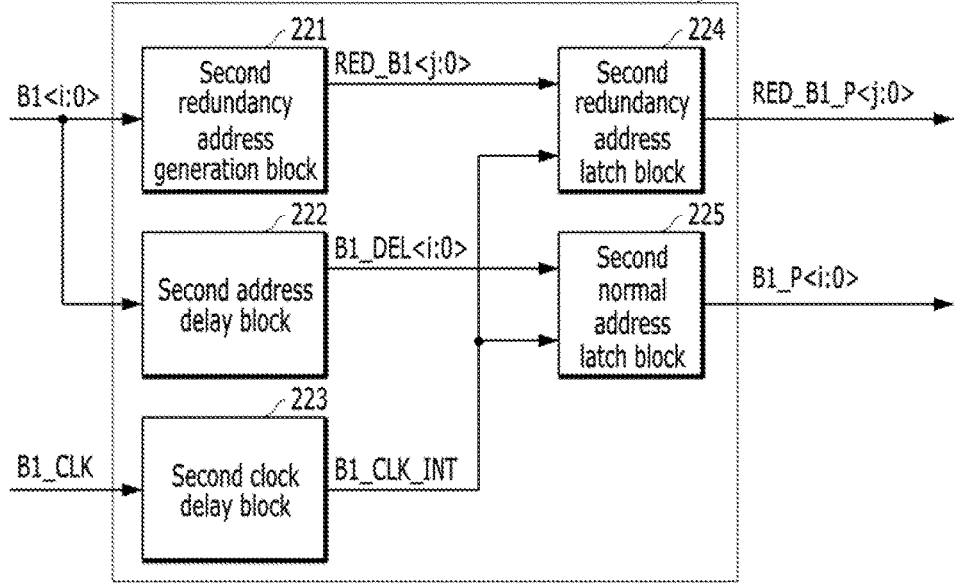

FIG. 6
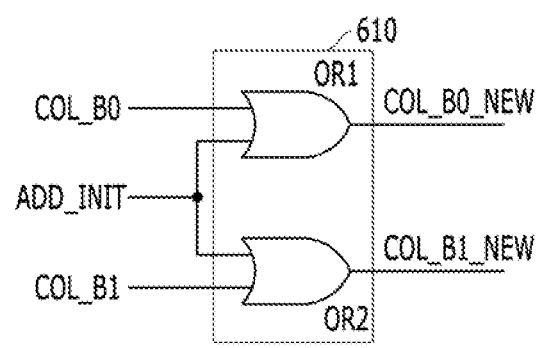
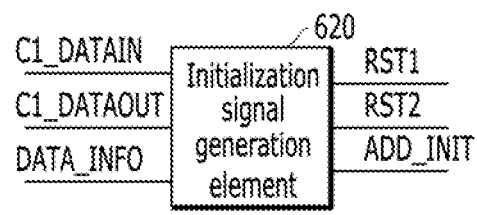

FIG. 7
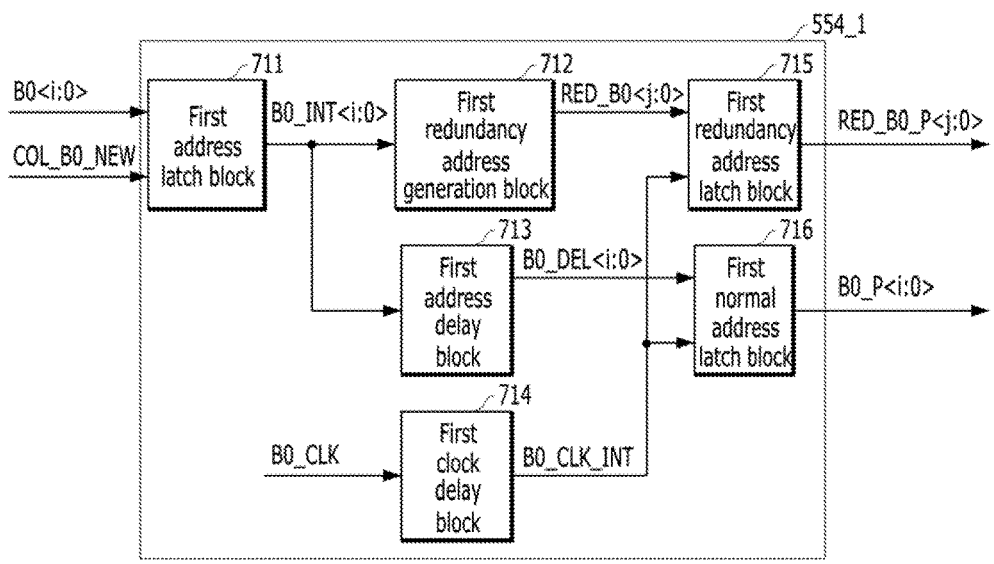
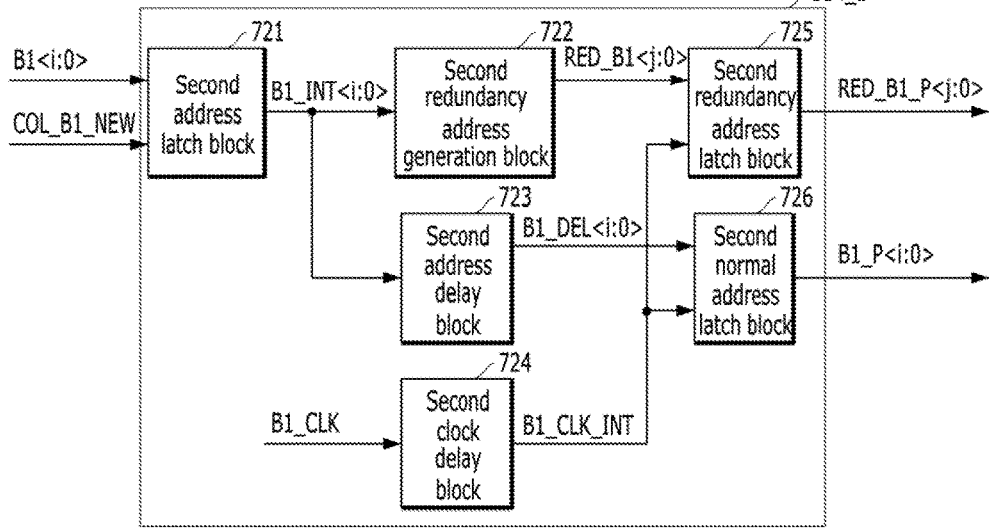

US 9,552,857 B1

ADDRESS GENERATION CIRCUIT AND SEMICONDUCTOR MEMORY DEVICE INCLUDING THE SAME

CROSS-REFERENCE TO RELATED APPLICATIONS

The present application claims priority under 35 U.S.C. §119(a) to Korean Patent Application No. 10-2016-0026358, filed on Mar. 4, 2016, which is incorporated herein by reference in its entirety.

BACKGROUND

1. Field

Exemplary embodiments of the present invention relate generally to semiconductor designing technology and, more particularly, to an address generation circuit for generating a redundancy address, and a semiconductor memory device including the address generation circuit.

2. Description of the Related Art

Semiconductor memory devices are largely divided into volatile memory devices and non-volatile memory devices.

Volatile memory devices are quick at writing and reading data, but the volatile memory devices lose the data stored therein when power supply is cut off. On the other hand, non-volatile memory devices are relatively slow at writing and reading data but they retain the data stored therein even though power supply is cut off. For this reason, the non-volatile memory devices are used to store data if the data have to be retained regardless of the power supply. Non-limiting examples of the non-volatile memory devices include a Read Only Memory (ROM), a Mask ROM (MROM), a Programmable ROM (PROM), an Erasable Programmable ROM (EPROM), an Electrically Erasable Programmable ROM (EEPROM), a flash memory, a Phase-Change Random Access Memory (PRAM), a Magnetic RAM (MRAM), a Resistive RAM (RRAM), a Ferroelectric RAM (FRAM) and the like. A flash memory may be NOR-type or NAND-type flash memory.

A flash memory has the advantage of a RAM device that data may be freely programmed or erased and the advantage of a ROM device that the data stored in the flash memory are retained even though power supply is cut off. Flash memory is widely used as storage media for portable electronic devices, such as digital cameras, Personal Digital Assistants (PDA), MP3 players, and the like.

A column address repair operation for replacing a failure memory cell with a normal memory cell may be performed to complement failure of a memory cell, which may occur in the process of fabricating a semiconductor memory device. As a result, the column address control time may be delayed due to the column address repair operation when a data input operation or a data output operation is performed in the semiconductor memory device. The delay in the column address repair operation may lead to timing delay in the entire data input/output operation that is performed in the inside of the semiconductor memory device. To internally complement the timing between data and clocks for the time delay according to the column address control time, additional delay cells are used in the semiconductor memory device. However, as the semiconductor memory device operates at a high data rate, use of delay cells may be increased substantially, which may lead to increased current consumption and chip size and fluctuation in process, voltage and temperature (PVT) conditions.

SUMMARY

Embodiments of the present invention are directed to a semiconductor memory device with optimized column address control during a data input operation.

In accordance with an embodiment of the present invention, an address generation circuit includes: a first address control clock generation unit suitable for generating a first address control clock signal in response to an internal clock signal; a second address control clock generation unit suitable for generating a second address control clock signal in response to one of an address initialization signal and the first address control clock signal; an address counting unit suitable for counting the second address control clock signal and generating a counting address; and a repair control unit suitable for latching the counting address in response to the second address control clock signal, comparing the latched counting address with a repair address, and generating a redundancy address based on the comparison result.

The second address control clock generation unit may include: an initialization signal generator suitable for generating the address Initialization signal in an initial duration of a data input/output operation; and a second address control clock generator suitable for generating the second address control clock signal when the address initialization signal or the first address control clock signal is enabled.

The initial duration of the data input/output operation may be a duration where the internal clock signal does not toggle.

The repair control unit may include: an address latch suitable for latching the counting address and generating an initial counting address in response to the second address control clock signal; and a redundancy address generator suitable for comparing the latched counting address with the repair address and generating the redundancy address based on the comparison result.

The address counting unit may perform a counting operation and generates the counting address, and the repair control unit generates the redundancy address in response to the initial counting address.

The repair control unit may further include: an address delayer suitable for generating a normal address by delaying the initial counting address by a predetermined time; a redundancy address latch suitable for latching the redundancy address in response to a bank clock control signal; and a normal address latch suitable for latching the normal address in response to the bank clock control signal.

The internal clock signal may be generated in response to a data strobe signal.

In accordance with another embodiment of the present invention, a semiconductor memory device includes: a memory cell array including a plurality of memory banks; a clock controller suitable for generating a plurality of clock signals by delaying an internal data strobe signal; an address controller suitable for generating a first address control clock signal and a second address control clock signal in response to an internal clock signal among the plurality of the clock signals, generating a counting address by counting the second address control clock signal, performing a repair operation in response to the counting address and the second address control clock signal so as to generate a redundancy address; and a data controller suitable for receiving a data from the memory cell array or transferring a data to the memory cell array at a moment when the redundancy address is transferred to the memory cell array in response to a data clock signal among the plurality of the clock signals, wherein the address controller also performs a repair operation together by using the counting address that is generated from a present counting operation and a previous counting operation.

The semiconductor memory device may further include: first and second page buffers corresponding to the first and second memory banks, respectively, suitable for reading and storing data out of the first and second memory banks; and an Input/output (IO) pad suitable for receiving a data strobe signal and an external data and outputting the internal data strobe signal and an internal data.

The clock controller may include: an input data clock generation unit suitable for generating the internal clock signal and the data clock signal in response to the internal data strobe signal; a bank control clock generation unit suitable for generating the first and second bank control clock signals which correspond to the plurality of the memory banks, respectively, in response to the internal clock signal; a first clock control unit suitable for generating a first page buffer selection signal for selecting the first page buffer in response to the first bank control clock signal; and a second clock control unit suitable for generating a second page buffer selection signal for selecting the second page buffer in response to the second bank control clock signal.

The address controller may include: a first address control clock generation unit suitable for generating the first address control clock signal corresponding to the first and second memory banks in response to the internal clock signal; a second address control clock generation unit suitable for generating the second address control clock signal corresponding to the first and second memory banks in response to one of an address initialization signal and the first address control clock signal; an address counting unit suitable for counting the second address control clock signal and generating a counting address corresponding to the first and second memory banks; and first and second repair control units suitable for latching the counting address corresponding to the first and second memory banks in response to the second address control clock signal, comparing the latched counting address with a repair target address, and generating the redundancy address based on the comparison result.

The second address control clock generation unit may include: an initialization signal generator suitable for generating the address initialization signal in an initial duration of a data input/output operation; and a second address control clock generator suitable for generating the second address control clock signal when the address initialization signal or the first address control clock signal is enabled.

The initial duration of the data input/output operation may be a duration where the internal clock signal does not toggle.

Each of the first and second repair control units may include: an address latch suitable for latching the counting address and generating an initial counting address in response to the second address control clock signal corresponding to the corresponding memory bank; and a redundancy address generator suitable for comparing the latched counting address with the repair address and generating the redundancy address based on the comparison result.

The address counting unit may perform a counting operation and generates the counting address, and the first and second repair control units generate the redundancy address in response to the initial counting address.

Each of the first and second repair control units may further include: an address delayer suitable for generating a normal address by delaying the initial counting address by a predetermined time; a redundancy address latch suitable for latching the redundancy address in response to a bank clock control signal; and a normal address latch suitable for latching the normal address in response to the bank clock control signal.

The bank control clock generation unit may generate a data control clock signal by delaying the data clock signal by a predetermined time, and generates first and second bank data clock signals in response to the data control clock signal.

The data controller may include: a data synchronization unit suitable for generating the data control clock signal by delaying the data clock signal by a predetermined time and synchronizing the internal data in response to the data control clock signal; and a data driving unit suitable for transferring a data transferred through the data synchronization unit to first and second global data lines in response to the first and second bank data clock signals.

BRIEF DESCRIPTION OF THE DRAWINGS

The above and other features and advantages of the present invention will become more apparent to those skilled in the art to which the present invention belongs by describing in detail various embodiments thereof with reference to the attached drawings in which:

FIG. 2 is a block diagram illustrating a configuration example of a repair control unit shown in FIG. 1.

FIG. 6 is a block diagram Illustrating a configuration example of a second address control clock generation unit shown in FIG. 5.

FIG. 7 is a block diagram illustrating a configuration example of a repair control unit shown in FIG. 5.

DETAILED DESCRIPTION

Figure 1:
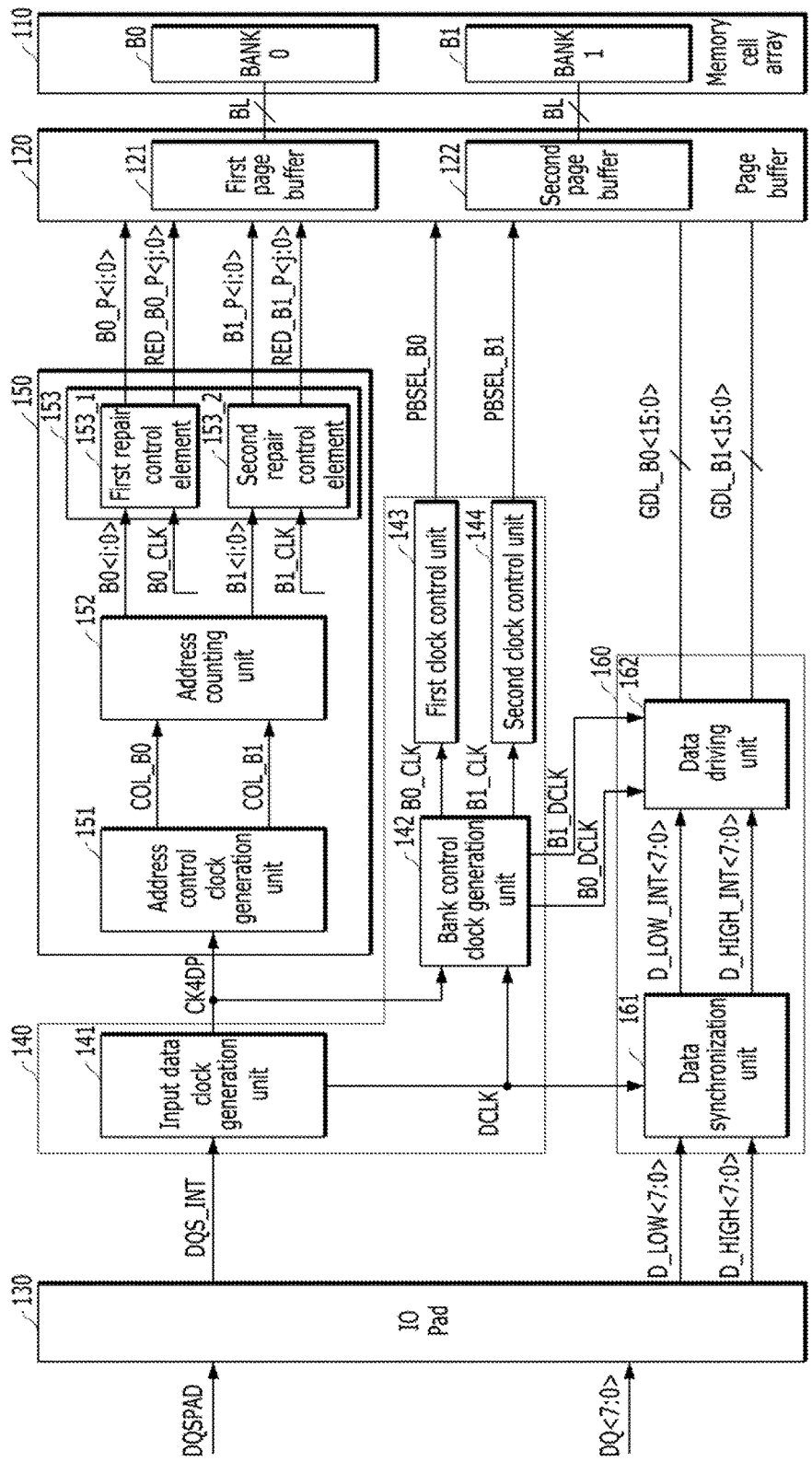
FIG. 1 is a block diagram illustrating a semiconductor memory device, according to a comparative example.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to more clearly illustrate the various elements of the embodiments. For example, in the drawings, the size of elements and the Intervals between elements may be exaggerated compared to actual sizes and intervals for convenience of illustration.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

As used herein, singular forms are intended to include the plural forms as well, unless the context clearly indicates otherwise.

It will be further understood that the terms "comprises", "comprising", "includes", and "including" when used in this specification, specify the presence of the stated elements and do not preclude the presence or addition of one or more other elements. As used herein, the term "and/or" includes any and all combinations of one or more of the associated listed items.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Hereinafter, the various embodiments of the present invention will be described in detail with reference to the attached drawings.

Throughout the disclosure, like reference numerals refer to like parts throughout the various figures and embodiments of the present invention.

FIG. 1 is a block diagram illustrating a semiconductor memory device according to a comparative example.

Referring to FIG. 1, the semiconductor memory device includes a memory cell array 110, a page buffer 120, an input/output (IO) pad 130, a clock controller 140, an address controller 150, and a data controller 160.

The memory cell array 110 may include first and second memory banks B0 B1. Each of the first and second memory banks B0 and B1 may include a plurality of memory blocks (not shown). The memory blocks may be coupled with a peripheral circuit (not shown) through word lines. Also, the memory blocks may be coupled with the page buffer 120 through bit lines BL.

The page buffer 120 may include a first page buffer 121 and a second page buffer 122. The first page buffer 121 may correspond to the first memory bank B0, whereas the second page buffer 122 may correspond to the second memory bank B1.

The IO pad 130 may include pads PAD (not shown) that are coupled with an external device (not shown). A data strobe signal DQSPAD and an external data DQ<7:0> may be received from the external device through the pads. The IO pad 130 may receive the data strobe signal DQSPAD and output an internal data strobe signal DQS_INT. The IO pad 130 may receive the external data DQ<7:0> and output a low data D_LOW<7:0> and a high data D_HIGH<7:0>. Herein, the low data D_LOW<7:0> may be a data of the external data DQ<7:0> that is inputted at a rising edge of the data strobe signal DQSPAD, and the high data D_HIGH<7:0> may be a data of the external data DQ<7:0> that is inputted at a falling edge of the data strobe signal DQSPAD.

The clock controller 140 may generate a plurality of data control clock signals for controlling data in response to the internal data strobe signal DQS_INT. The clock controller 140 may include an input data clock generation unit 141, a bank control clock generation unit 142, a first clock control unit 143, and a second clock control unit 144.

The input data clock generation unit 141 may generate an internal clock signal CK4DP and a data clock signal DCLK in response to the internal data strobe signal DQS_INT. The internal clock signal CK4DP may be a clock signal for controlling a column address and a bank address, and the data clock signal DCLK may be a clock signal for synchronizing data with each other.

The bank control clock generation unit 142 may generate a first bank control clock signal B0_CLK and a second bank control clock signal B1_CLK in response to the internal clock signal CK4DP. The bank control clock generation unit 142 may also generate a data control clock signal CK4DP_DAT (not shown) internally in response to the data clock signal DCLK, and may generate a first bank data clock signal B0_DCLK and a second bank data clock signal B1_DCLK. Herein, the first bank control clock signal B0_CLK and the second bank control clock signal B1_CLK may be the clock signals for controlling the operation of the corresponding memory banks B0 and B1, respectively. The first bank data clock signal B0_DCLK and the second bank data clock signal B1_DCLK may be clock signals for controlling the driving of the data of the corresponding memory banks B0 and B1.

The first clock control unit 143 and the second clock control unit 144 may respectively receive the first bank control clock signal B0_CLK and the second bank control clock signal B1_CLK and generate an internal bank control clock signal (not shown). The first clock control unit 143 may generate a first page buffer selection signal PBSEL_B0 for selecting the first page buffer 121 in response to the internal bank control clock signal, and the second clock control unit 144 may generate a second page buffer selection signal PBSEL_B1 for selecting the second page buffer 122 in response to the internal bank control clock signal.

The address controller 150 may include an address control clock generation unit 151, an address counting unit 152, and a repair control unit 153.

The address control clock generation unit 151 may generate first and second address control clock signals COL_B0 and COL_B1 for synchronizing an address in response to the internal clock signal CK4DP. Herein, the first address control clock signal COL_B0 may be a clock signal corresponding to the first memory bank B0, and the second address control clock signal COL_B1 may be a clock signal corresponding to the second memory bank B1.

The address counting unit 152 may perform a counting operation in response to the first address control clock signal COL_B0 and the second address control clock signal COL_B1 and generate a first counting address B0<i:0> and a second counting address B1<i:0> which correspond to the first memory bank B0 and the second memory bank B1, respectively.

The repair control unit 153 may include a first repair control element 153_1 and a second repair control element 153_2.

The first repair control element 153_1 may compare the first counting address B0<i:0> with an internally stored repair address (not shown) in response to the first bank control clock signal B0_CLK and generate a first normal address B0_P<i:0> and a first redundancy address RED_B0_P<j:0>. Herein, the first normal address B0_P<i:0> and the first redundancy address RED_B0_P<j:0> may correspond to the first memory bank B0.

The second repair control element 153_2 may compare the second counting address B1<i:0> with the Internally stored repair address (not shown) in response to the second bank control clock signal B1_CLK and generate a second normal address B1_P<i:0> and a second redundancy address RED_B1_P<j:0>. Herein, the second normal address B1_P<i:0> and the second redundancy address RED_B1_P<j:0> may correspond to the second memory bank B1.

The data controller 160 may include a data synchronization unit 161 and a data driving unit 162. The data synchronization unit 161 may internally generate a data control clock signal CK4DP_DAT (not shown) in response to the data clock signal DCLK, and may synchronize a low data D_LOW<7:0> and a high data D_HIGH<7:0> in response to the data control clock signal CK4DP_DAT and output an internal low data D_LOW_INT<7:0> and an internal high data D_HIGH_INT<7:0>.

The data driving unit 162 may transfer the internal low data D_LOW_INT<7:0> and the internal high data D_HIGH_INT<7:0> to first global data lines GDL_B0<15:0> in response to the first bank data clock signal B0_DCLK, and may transfer the internal low data D_LOW_INT<7:0> and the internal high data D_HIGH_INT<7:0> to second global data lines GDL_B1<15:0> in response to the second bank data clock signal B1_DCLK.

Although not illustrated in FIG. 1, the semiconductor memory device may include a peripheral circuit that includes circuits for operating along with the page buffer 120 when data are read out of the memory cells or data are stored in the memory cells. The peripheral circuit may include a voltage generation circuit for generating operation voltages to be applied to the memory cells when a general operation, such as a program operation and a read operation is performed on the memory cells, and a row decoder for transferring the operation voltages generated in the voltage generation circuit to the memory cells based on a row address inputted from the exterior of the semiconductor memory device.

FIG. 2 illustrates a configuration example of the repair control unit 153 shown in FIG. 1.

Referring to FIGS. 1 and 2, the repair control unit 153 may include the first repair control element 153_1 and the second repair control element 153_2. Since the first repair control element 153_1 and the second repair control element 153_2 have the same structure and perform the same operation, the first repair control element 153_1 is representatively described herein.

The first repair control element 153_1 may include a first redundancy address generation block 211, a first address delay block 212, a first clock delay block 213, a first redundancy address latch block 214, and a first normal address latch block 215.

The first redundancy address generation block 211 may receive the first counting address B0<i:0>, compare the received first counting address B0<i:0> with an internally stored repair address (not shown), and decide whether the received first counting address B0<i:0> is a repair target address or not. When it is a repair target address, the first redundancy address generation block 211 may generate a redundancy address RED_B0<j:0>.

The first address delay block 212 may delay the first counting address B0<i:0> by a predetermined time and output a delayed first normal address B0_DEL<i:0>.

The first clock delay block 213 may delay the first bank control clock signal B0_CLK by a predetermined time and generate a delayed first internal bank control clock signal B0_CLK_INT.

The first redundancy address latch block 214 may latch the first redundancy address RED_B0<j:0> in response to the delayed first internal bank control clock signal B0_CLK_INT and output a first final redundancy address RED_B0_P<j:0>

The first normal address latch block 215 may latch the delayed first normal address B0_DEL<i:0> in response to the delayed first internal bank control clock signal B0_CLK_INT and output the first final normal address B0_P<i:0>.

Herein, each of the first redundancy address latch block 214 and the first normal address latch block 215 may be implemented with D-flip flops to synchronize the timings of the first redundancy address RED_B0<j:0> and the delayed first normal address B0_DEL<i:0>.

Hereafter, an operation of the semiconductor memory device is described with reference to FIGS. 3 and 4.

Figure 3:
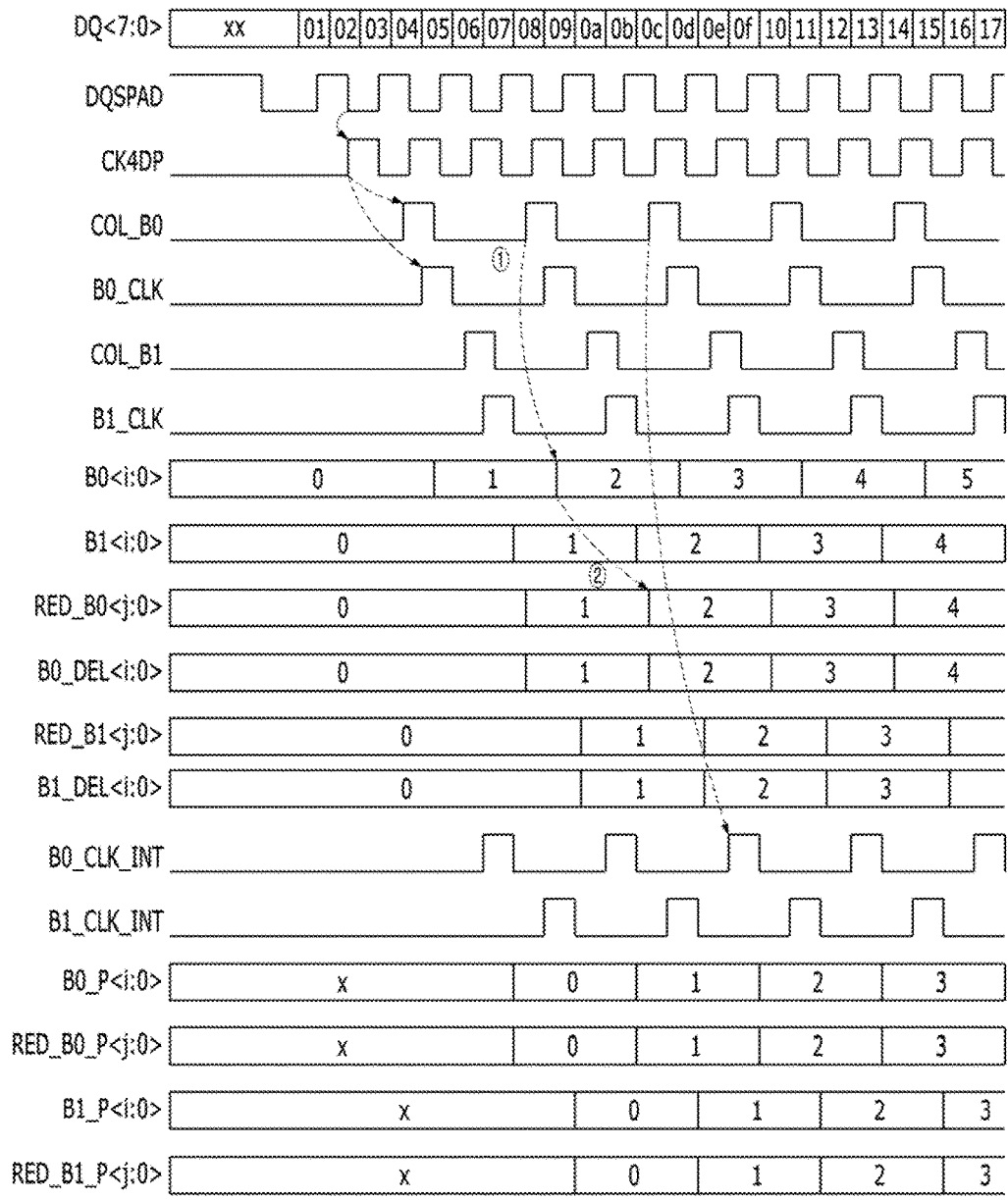
FIG. 3 is a timing diagram illustrating an address control operation of the semiconductor memory device shown in FIG. 1.

FIG. 3 is a timing diagram illustrating an address control operation of the semiconductor memory device shown in FIG. 1.

Referring to FIG. 3, a one-byte external data DQ<7:0> may be received at a rising edge and a falling edge of the data strobe signal DQSPAD during a data input operation.

In response to the data strobe signal DQSPAD, the Internal clock signal CK4DP may be generated. In response to the internal clock signal CK4DP, the first and second address control clock signals COL_B0 and COL_B1 and the first and second bank control clock signals B0_CLK and B1_CLK may be generated. Herein, the first and second address control clock signals COL_B0 and COL_B1 and the first and second bank control clock signals B0_CLK and B1_CLK may be generated to have a margin of 2tck for address synchronization, individually.

Subsequently, the first counting address B0<i:0> and the second counting address B1<i:0> may be transferred in response to the first and second address control clock signals COL_B0 and COL_B1. First and second redundancy addresses RED_B0<j:0> and RED_B1<j:0> and delayed first and second normal addresses B0_DEL<i:0> and B1_DEL<i:0> may be generated by comparing the first counting address B0<i:0> and the second counting address B1<i:0> with a repair address corresponding to the corresponding bank.

Delayed first and second internal bank control clock signals B0_CLK_INT and B1_CLK_INT may be generated by delaying the first and second bank control clock signals B0_CLK and B1_CLK by a predetermined time. Subsequently, a first final redundancy address RED_B0_P<j:0> and a first final normal address B0_P<i:0> whose timings are controlled to be the same may be outputted by synchronizing the first redundancy address RED_B0<j:0> and the delayed first normal address B0_DEL<i:0> to the delayed first internal bank control clock signal B0_CLK_INT. Also, a second final redundancy address RED_B1_P<j:0> and a second final normal address B1_P<i:0> whose timings are controlled to be the same may be outputted by synchronizing the second redundancy address RED_B1<j:0> and the delayed second normal address B1_DEL<i:0> to the delayed second internal bank control clock signal B1_CLK_INT.

Figure 4:
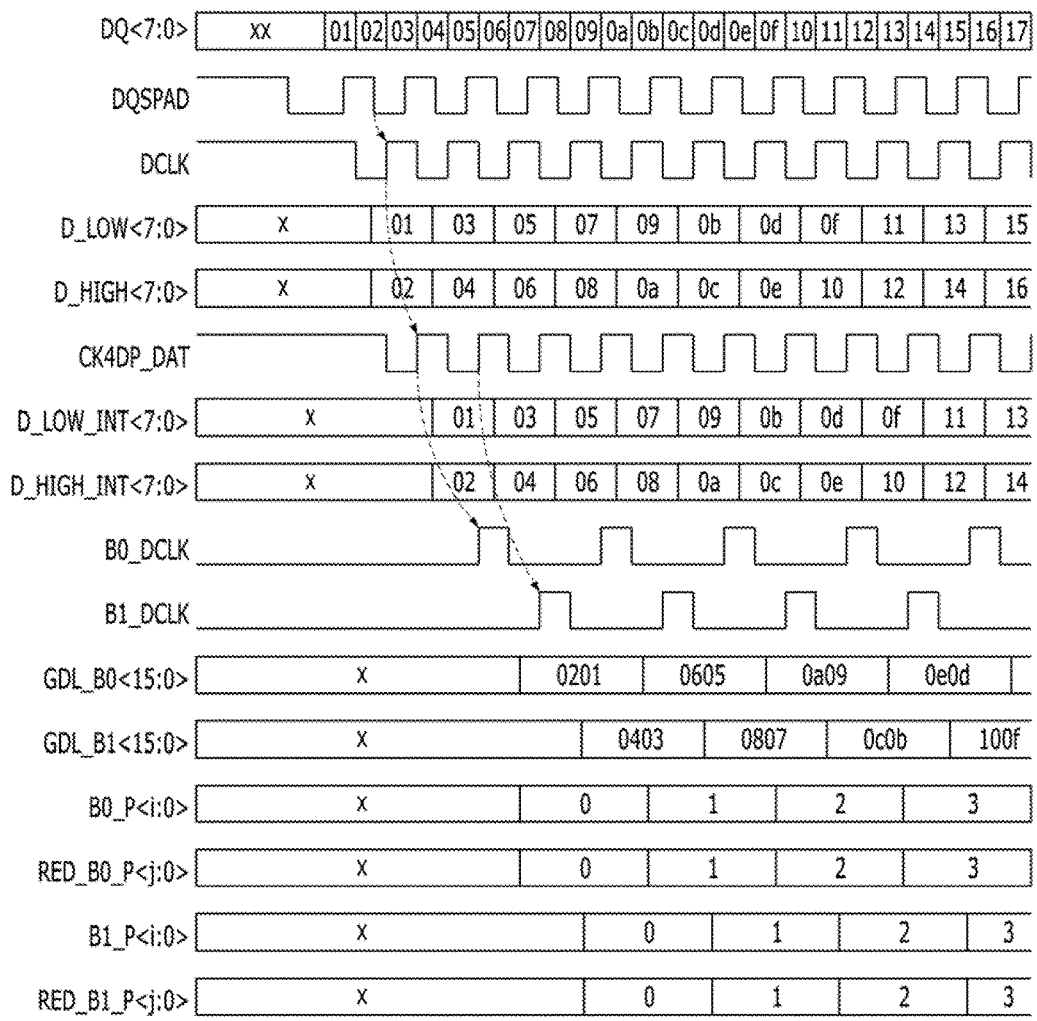
FIG. 4 is a timing diagram illustrating a data control operation of the semiconductor memory device shown in FIG. 1.

FIG. 4 is a timing diagram illustrating a data control operation of the semiconductor memory device shown in FIG. 1.

Referring to FIG. 4, during a data input operation, a one-type external data DQ<7:0> may be received at a rising edge and a falling edge of the data strobe signal DQSPAD. The data of the external data DQ<7:0> received at a rising edge of the data strobe signal DQSPAD may be sequentially outputted by two bytes as a low data D_LOW<7:0>. The data of the external data DQ<7:0> received at a falling edge of the data strobe signal DQSPAD may be sequentially outputted by two bytes as a high data D_HIGH<7:0>.

For example, the clock signals for controlling the data, an internal clock signal CK4DP, may be generated in response to the data strobe signal DQSPAD. Also, a data clock signal DCLK may be generated by delaying the internal clock signal CK4DP by a predetermined time, and a data control clock signal CK4DP_DAT may be generated by delaying the data clock signal DCLK by a predetermined time. Herein, the low data D_LOW<7:0> and the high data D_HIGH<7:0> may be outputted as an internal low data D_LOW_INT<7:0> and an internal high data D_HIGH_INT<7:0> in synchronization with the data control clock signal CK4DP_DAT.

Subsequently, a first bank data clock signal B0_DCLK and a second bank data clock signal B1_DCLK may be generated in response to the data control clock signal CK4DP_DAT. Each of the first bank data clock signal B0_DCLK and the second bank data clock signal B1_DCLK may be generated to have a margin of 2tck for data synchronization.

The data driving unit 162 then may transfer data through first global data lines GDL_B0<15:0> and second global data lines GDL_B1<15:0> in response to the first bank data clock signal B0_DCLK and the second bank data clock signal B1_DCLK having the margin of 2tck.

Meanwhile, referring to FIG. 3, after the first address control clock signal COL_B0 is enabled, a repair time (①+②) may be decided based on an address transfer time (①) toward the repair control unit 153 and a first redundancy address generation time (②) taken for generating the first redundancy address RED_B0<j:0>.

In the semiconductor memory device according to the comparative embodiment of the present invention, each of the first and second bank control clock signals B0_CLK and B1_CLK has the margin of 2tck for address synchronization. However, since the semiconductor memory device operates at a high data rate, the tck of the margin is decreased as time passes. However, since the address control time requires a fixed time regardless of the decreasing tck, the compensation for the timing of the first and second bank control clock signals B0_CLK and B1_CLK, which is a delay amount, is increased continuously. For this reason, the delay in the repair time (①+②) may be increased as well.

Also, the data transferred through the first global data lines GDL_B0<15:0> and the second global data lines GDL_B1<15:0> may be compensated by the data control clocks for timing according to the timings of the first and second final normal addresses B0_P<i:0> and B1_P<i:0> and the first and second redundancy addresses RED_B0_P<j:0> and RED_B1_P<j:0> that are transferred to the page buffer 120 at the end after going through address control.

In other words, the data control, too, is operated with the margin of 2tck just as the address control is. Therefore, as the semiconductor memory device operates at a high data rate, current consumption may be increased due to the timing compensation resulting from the time needed for address control, and the chip size may become bigger as a control circuit for controlling the increasing current consumption is added.

Figure 5:
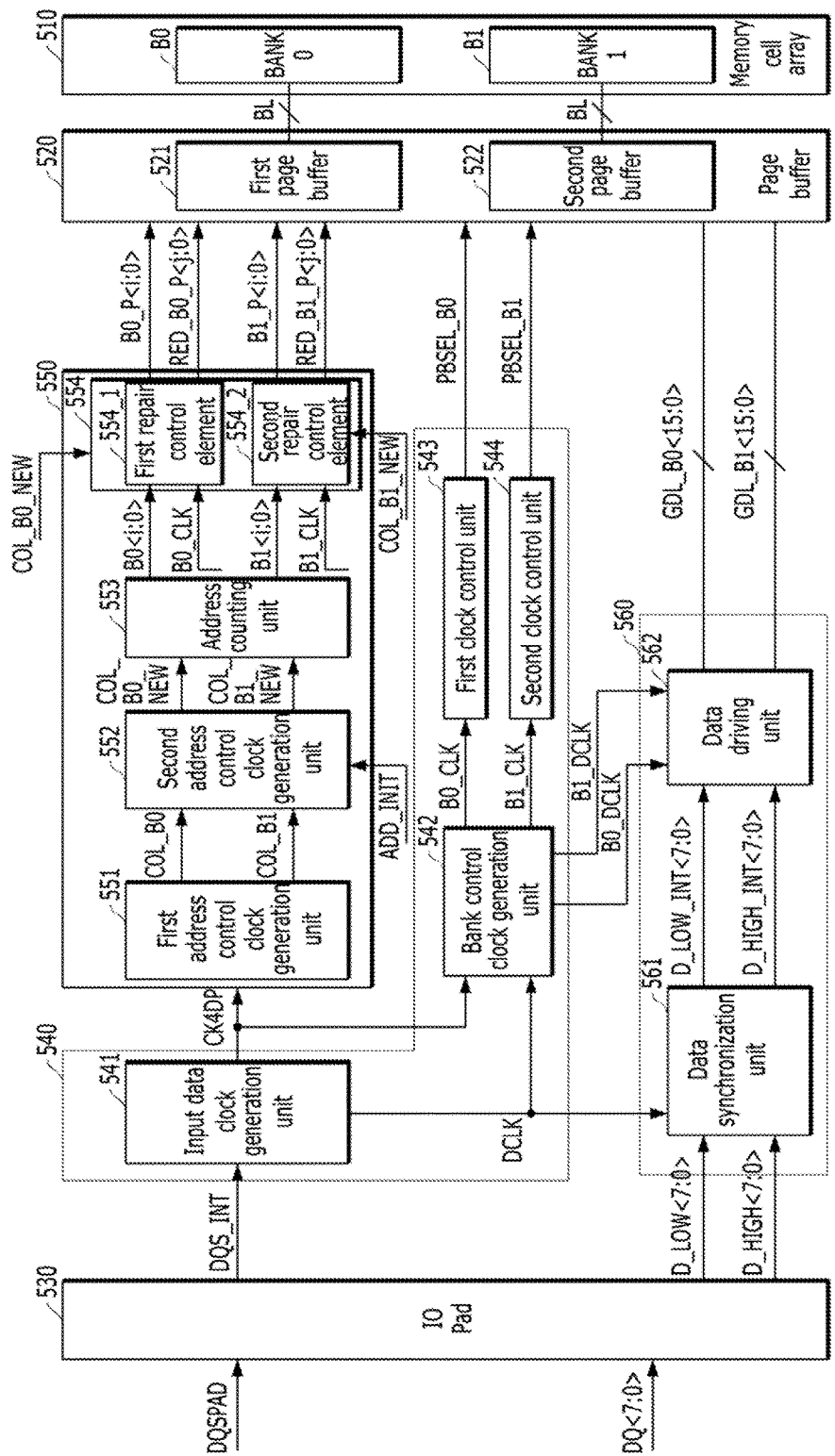
FIG. 5 is a block diagram illustrating a semiconductor memory device, according to an embodiment of the present invention.

FIG. 5 is a block diagram Illustrating a semiconductor memory device, according to an embodiment of the present invention.

Referring to FIG. 5, the semiconductor memory device 500 includes a memory cell array 510, a page buffer 520, an input/output (IO) pad 530, a clock controller 540, an address controller 550, and a data controller 560.

The memory cell array 510 may include a first memory bank B0 and a second memory bank B1. Herein, the memory cell array 510 formed of the first memory bank B0 and the second memory bank B1 may be defined as a memory plane PLANE.

Each of the first and second memory banks B0 and B1 may include a plurality of memory blocks (not shown). The memory blocks may be coupled with a peripheral circuit (not shown) through word lines. Also, the memory blocks may be coupled with the page buffer 520 through bit lines BL. Each of the memory blocks may include a plurality of memory strings. Each memory string may include a drain select transistor, a plurality of memory cells, and a source select transistor that are serially coupled between a bit line BL and a source line (not shown). In this embodiment of the present invention, the memory cells are non-volatile memory cells. The memory cells may be non-volatile memory cells based on a charge-trapping device.

The page buffer 520 may include first and second page buffers 521 and 522. The first page buffer 521 may correspond to the first memory bank B0, whereas the second page buffer 522 may correspond to the second memory bank B1.

Each of the first and second page buffers 521 and 522 may include a plurality of page buffers (not shown). The page buffers may be coupled with a corresponding bit line BL among the bit lines BL of the memory cell array 510.

The page buffers may temporarily store data to be stored in selected memory cells, or the page buffers may read and store the data stored in the selected memory cells. Also, the page buffers may output the stored data to global data lines GDL_B0<15:0> and GDL_B1<15:0> in response to a column select signal (not shown) during a data output operation.

The IO pad 530 may include pads PAD that are coupled with an external device (not shown). A data strobe signal DQSPAD and an external data DQ<7:0> may be received from the external device through the pads. The IO pad 530 may receive the data strobe signal DQSPAD and output an internal data strobe signal DQS_INT. The IO pad 530 may also receive the external data DQ<7:0> and output a low data D_LOW<7:0> and a high data D_HIGH<7:0>. Herein, the low data D_LOW<7:0> may be a data of the external data DQ<7:0> that is inputted at a rising edge of the data strobe signal DQSPAD, and the high data D_HIGH<7:0> may be a data of the external data DQ<7:0> that is inputted at a falling edge of the data strobe signal DQSPAD.

The clock controller 540 may generate a plurality of data control clock signals for controlling the transfer of data in response to the internal data strobe signal DQS_INT. The clock controller 540 may include an input data clock generation unit 541, a bank control clock generation unit 542, a first clock control unit 543, and a second clock control unit 544.

The input data clock generation unit 541 may generate an internal clock signal CK4DP and a data clock signal DCLK in response to the internal data strobe signal DQS_INT. The internal clock signal CK4DP may control a column address and a bank address. The data clock signal DCLK may be used for synchronizing data with each other.

The bank control clock generation unit 542 may generate first and second bank control clock signals B0_CLK and B1_CLK in response to the internal clock signal CK4DP. The bank control clock generation unit 542 may also generate a data control clock signal CK4DP_DAT (not shown) internally in response to the data clock signal DCLK. The bank control clock generation unit 542 may further generate a first bank data clock signal B0_DCLK and the second bank data clock signal B1_DCLK. Herein, the first and second bank control clock signals B0_CLK and B1_CLK may be used for controlling the operation of the corresponding memory banks B0 and B1, respectively. The first and second bank data clock signals B0_DCLK and B1_DCLK may be used for controlling the driving of the data of the corresponding memory banks B0 and B1, respectively.

The first and second clock control units 543 and 544 may respectively receive the first and second bank control clock signals B0_CLK and B1_CLK and generate an internal bank control clock signal (not shown). The first clock control unit 543 may generate a first page buffer selection signal PBSEL_B0 for selecting the first page buffer 521 in response to the internal bank control clock signal. The second clock control unit 544 may generate a second page buffer selection signal PBSEL_B1 for selecting the second page buffer 522 in response to the internal bank control clock signal.

The address controller 550 may include a first address control clock generation unit 551, a second address control clock generation unit 552, an address counting unit 553, and a repair control unit 554.

The first address control clock generation unit 551 may generate first address control clock signals COL_B0 and COL_B1 for synchronizing an address in response to the internal clock signal CK4DP. The first address control clock signals COL_B0 and COL_B1 may correspond to the first and second memory banks B0 and bank B1, respectively.

The second address control clock generation unit 552 may generate second address control clock signals COL_B0_NEW and COL_B1_NEW in response to an address initialization signal ADD_INIT and the first address control clock signals COL_B0 and COL_B1. Herein, the second address control clock signals COL_B0_NEW and COL_B1_NEW may correspond to the first and second memory banks B0 and B1, respectively.

The address counting unit 553 may perform a counting operation in response to the second address control clock signals COL_B0_NEW and COL_B1_NEW and generate a first counting address B0<i:0> and a second counting address B1<i:0> which correspond to the first memory bank B0 and the second memory bank B1, respectively.

The repair control unit 554 may include a first repair control element 554_1 and a second repair control element 554_2.

The first repair control element 554_1 may latch a column address that is initially set in response to the second address control clock signal COL_B0_NEW corresponding to the first memory bank B0. Also, the first repair control element 554_1 may compare the latched initial column address with an internally stored repair address (not shown) in response to the first bank control clock signal B0_CLK and generate a first normal address B0_P<i:0> and a first redundancy address RED_B0_P<j:0>. Herein, the first normal address B0_P<i:0> and the first redundancy address RED_B0_P<j:0> may correspond to the first memory bank B0.

The second repair control element 554_2 may latch a column address that is initially set in response to the second address control clock signal COL_B1_NEW corresponding to the second memory bank B1. Also, the second repair control element 554_2 may compare the latched initial column address with the internally stored repair address (not shown) in response to the second bank control clock signal B1_CLK and generate a second normal address B1_P<i:0> and a second redundancy address RED_B1_P<j:0>. Herein, the second normal address B1_P<i:0> and the second redundancy address RED_B1_P<j:0> may correspond to the second memory bank B1.

The repair control unit 554 may latch the column address that is initially set based on the address initialization signal ADD_INIT in response to the second address control clock signals COL_B0_NEW and COL_B1_NEW, and the address counting unit 553 may perform a control in such a manner that the next address transitions in advance. Hence, the previous address which is retained while the address counting unit 553 generates the next address may be transferred to the repair control unit 554 in response to the second address control clock signals COL_B0_NEW and COL_B1_NEW.

The data controller 560 may include a data synchronization unit 561 and a data driving unit 562. The data synchronization unit 561 may internally generate a data control clock signal CK4DP_DAT in response to the data clock signal DCLK. Also, the data synchronization unit 561 may synchronize a low data D_LOW<7:0> and a high data D_HIGH<7:0> in response to the data control clock signal CK4DP_DAT and output an internal low data D_LOW_INT<7:0> and an internal high data D_HIGH_INT<7:0>.

The data driving unit 562 may transfer the internal low data D_LOW_INT<7:0> and the internal high data D_HIGH_INT<7:0> to first global data lines GDL_B0<15:0> in response to the first bank data clock signal B0_DCLK. Also, the data driving unit 562 may transfer the internal low data D_LOW_INT<7:0> and the internal high data D_HIGH_INT<7:0> to second global data lines GDL_B1<15:0> in response to the second bank data clock signal B1_DCLK.

We note, that although not illustrated herein, the semiconductor memory device according to an embodiment of the present invention may include a peripheral circuit that includes circuits for operating along with the page buffer 520 when data are read out of the memory cells or data are stored in the memory cells. For example, the peripheral circuit may include a voltage generation circuit for generating operation voltages to be applied to the memory cells when a general operation, such as a program operation and/or a read operation is performed on the memory cells, and a row decoder for transferring the operation voltages generated in the voltage generation circuit to the memory cells based on a row address inputted from the exterior of the semiconductor memory device.

FIG. 6 illustrates a configuration example of the second address control clock generation unit 552 shown in FIG. 5.

Referring to FIG. 6, the second address control clock generation unit 552 may include a second address control clock generation element 610 and an initialization signal generation element 620.

The second address control clock generation element 610 may include first and second OR gates OR1 and OR2. The first OR gate OR1 may generate the second address control clock signal COL_B0_NEW corresponding to the first memory bank B0 in response to the address initialization signal ADD_INIT and the first address control clock signal COL_B0 corresponding to the first memory bank B0. The second OR gate OR2 may generate the second address control clock signal COL_B1_NEW corresponding to the second memory bank B1 in response to the address initialization signal ADD_INIT and the second address control clock signal COL_B1 corresponding to the second memory bank B1.

The initialization signal generation element 620 may generate a first reset signal RST1, a second reset signal RST2, and the address initialization signal ADD_INIT in response to a data input signal C1_DATAIN, a data output signal C1_DATAOUT, and data input/output information DATA_INFO. The data input signal C1_DATAIN may be enabled during an initialization period of a data input operation. The data output signal C1_DATAOUT may be enabled during an initialization period of a data output operation. For example, the data input signal C1_DATAIN and the data output signal C1_DATAOUT may be the signals that are enabled before the data input/output operation are substantially performed, that is, before valid data input/output operations are performed. Also, the data input/output information DATA_INFO may be enabled when valid data are inputted/outputted while the data input/output operation are performed in response to the data input signal C1_DATAIN and the data output signal C1_DATAOUT. Hence, when the data input signal C1_DATAIN and the data output signal C1_DATAOUT are enabled and the data input/output information DATA_INFO is disabled, the first reset signal RST1, the second reset signal RST2, and the address initialization signal ADD_INIT may be generated.

FIG. 7 illustrates a configuration example of the repair control unit 554 shown in FIG. 5.

Referring back to FIGS. 5 and 6, the repair control unit 554 may include the first and second repair control elements 554_1 and 554_2. Since the first and second repair control elements 554_1 and 554_2 may have the same structure and perform the same operation, the first repair control element 554_1 is representatively described herein and the descriptions for the second repair control element 554_2 will be omitted.

The first repair control element 554_1 may include a first address latch block 711, a first redundancy address generation block 712, a first address delay block 713, a first clock delay block 714, a first redundancy address latch block 715, and a first normal address latch block 716.

The first address latch block 711 may receive the first counting address B0<i:0> and output the initially set column address as a first initial counting address B0_INT<i:0> in response to the second address control clock signal COL_B0_NEW. The first address latch block 711 may be implemented with a D-flip flop for latching the first counting address B0<i:0>.

The first redundancy address generation block 712 may receive the first initial counting address B0_INT<i:0>, compare the received first initial counting address B0_INT<i:0> with the internally stored repair address (not shown), and decide whether the received first initial counting address B0_INT<i:0> is a repair target address or not. When it is a repair target address, the first redundancy address generation block 712 may generate a redundancy address RED_B0<j:0>.

The first address delay block 713 may delay the first initial counting address B0_INT<i:0> by a predetermined time and output a normal address B0_DEL<i:0>.

The first clock delay block 714 may delay the first bank control clock signal B0_CLK by a predetermined time and generate a delayed first internal bank control clock signal B0_CLK_INT.

The first redundancy address latch block 715 may latch the first redundancy address RED_B0<j:0> in response to the delayed first internal bank control clock signal B0_CLK_INT and output a first final redundancy address RED_B0_P<j:0>

The first normal address latch block 716 may latch the normal address B0_DEL<i:0> in response to the delayed first internal bank control clock signal B0_CLK_INT and output the first final normal address B0_P<i:0>.

Herein, each of the first redundancy address latch block 715 and the first normal address latch block 716 may be implemented with D-flip flops for synchronizing the timings of the first redundancy address RED_B0<j:0> and the normal address B0_DEL<i:0>.

Hereafter, an operation of the semiconductor memory device is described with reference to FIGS. 8 and 9.

Figure 8:
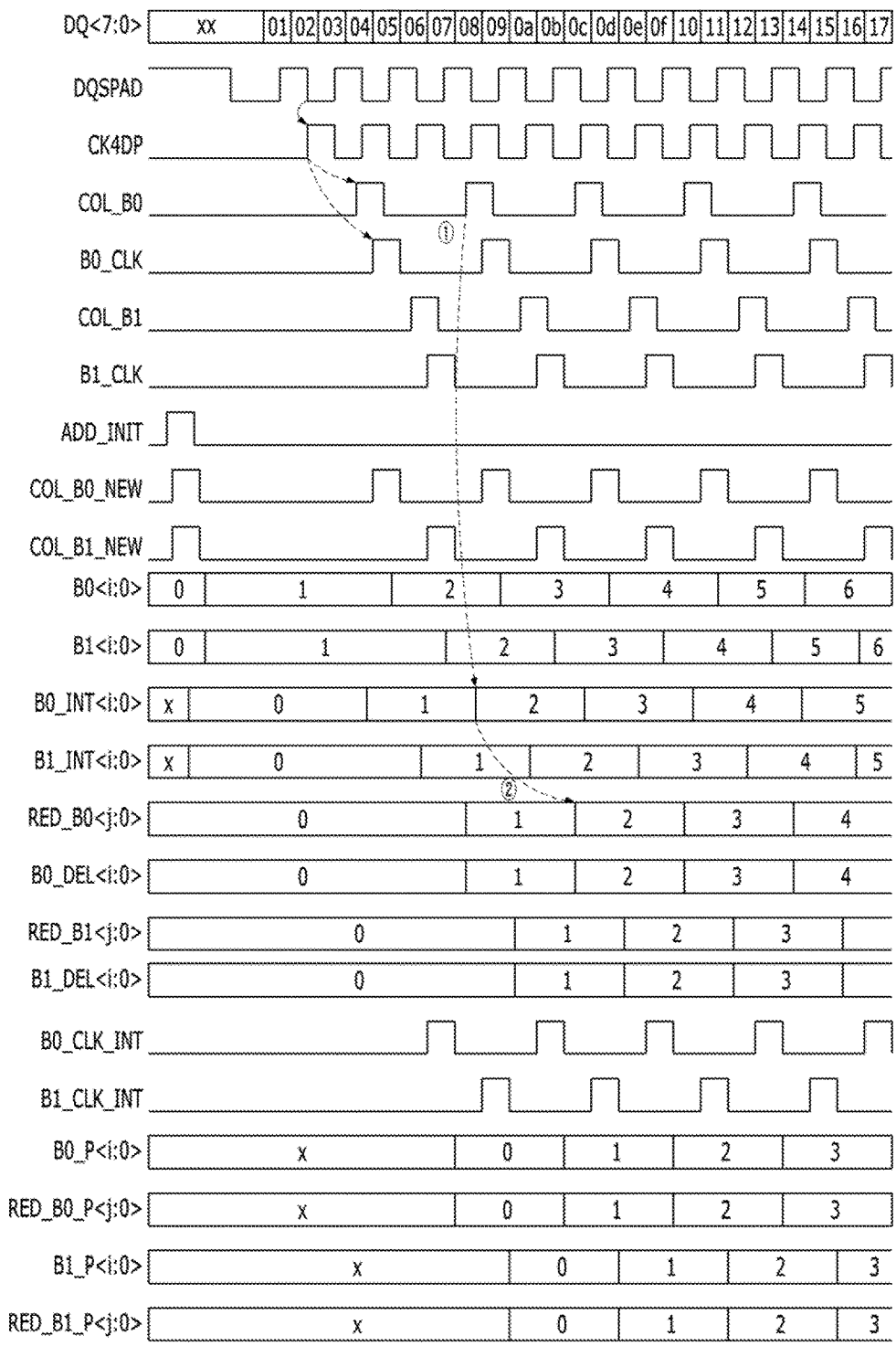
FIG. 8 is a timing diagram illustrating an address control operation of the semiconductor memory device shown in FIG. 5, according to an embodiment of the present invention.

FIG. 8 is a timing diagram illustrating an address control operation of the semiconductor memory device shown in FIG. 5.

Referring to FIG. 8, before a data DQ<7:0> is inputted, the address initialization signal ADD_INIT is enabled to enable the second address control clock signals COL_B0_NEW and COL_B1_NEW. The $0^{th}$ address of the initially set first and second counting addresses B0<i:0> and B1<i:0> is delivered as initial counting addresses B0_INT<i:0> and B1_INT<i:0> and at the same time, the first and second counting addresses B0<i:0> and B1<i:0> may be changed into the next address, which is the first address, after the operation of the address counting unit 553.

Subsequently, a one-byte external data DQ<7:0> may be received at a rising edge and a falling edge of the data strobe signal DQSPAD during a data input operation.

In response to the data strobe signal DQSPAD, the Internal clock signal CK4DP may be generated. In response to the internal clock signal CK4DP, the first and second address control clock signals COL_B0 and COL_B1 and the first and second bank control clock signals B0_CLK and B1_CLK may be generated. Herein, the first and second address control clock signals COL_B0 and COL_B1 and the first and second bank control clock signals B0_CLK and B1_CLK may be generated to have a margin of 2tck for address synchronization, individually.

Subsequently, the first counting address B0<i:0> and the second counting address B1<i:0> may be changed into the next address, which is the second address, in response to the first address control clock signal COL_B0 and the second address control clock signal COL_B1, respectively. Thus, the first initial counting address B0_INT<i:0> and the second initial counting address B1_INT<i:0>, too, may be changed into the next address, which is the second address.

First and second redundancy addresses RED_B0<j:0> and RED_B1<j:0> and delayed first and second normal addresses B0_DEL<i:0> and B1_DEL<i:0> may be generated by comparing the first Initial counting address B0_INT<i:0> and the second initial counting address B1_INT<i:0> with a repair address corresponding to the corresponding bank.

As described above, after the initial address of the counting addresses B0<i:0> and B1<i:0> is latched in advance and then the first address control clock signals COL_B0 and COL_B1 are enabled through the operation of counting the next address, it may be seen that an address transfer time (①) taken to transfer an address to the repair control unit 544 and a first redundancy address generation time (②) taken for generating the first redundancy address RED_B0_P<j:0> are decreased compared to conventional technology. For this reason, a repair time (①+②) may be decreased as well.

First and second internal bank control clock signals B0_CLK_INT and B1_CLK_INT may be generated by delaying the first and second bank control clock signals B0_CLK and B1_CLK. Subsequently, a first final redundancy address RED_B0_P<j:0> and a first final normal address B0_P<i:0> whose timings are controlled to be the same may be outputted by synchronizing the first redundancy address RED_B0<j:0> with the first internal bank control clock signal B0_CLK_INT. Also, a second final redundancy address RED_B1_P<j:0> and a second final normal address B1_P<i:0> whose timings are controlled to be the same may be outputted by synchronizing the second redundancy address RED_B1<j:0> with the second internal bank control clock signal B1_CLK_INT.

Figure 9:
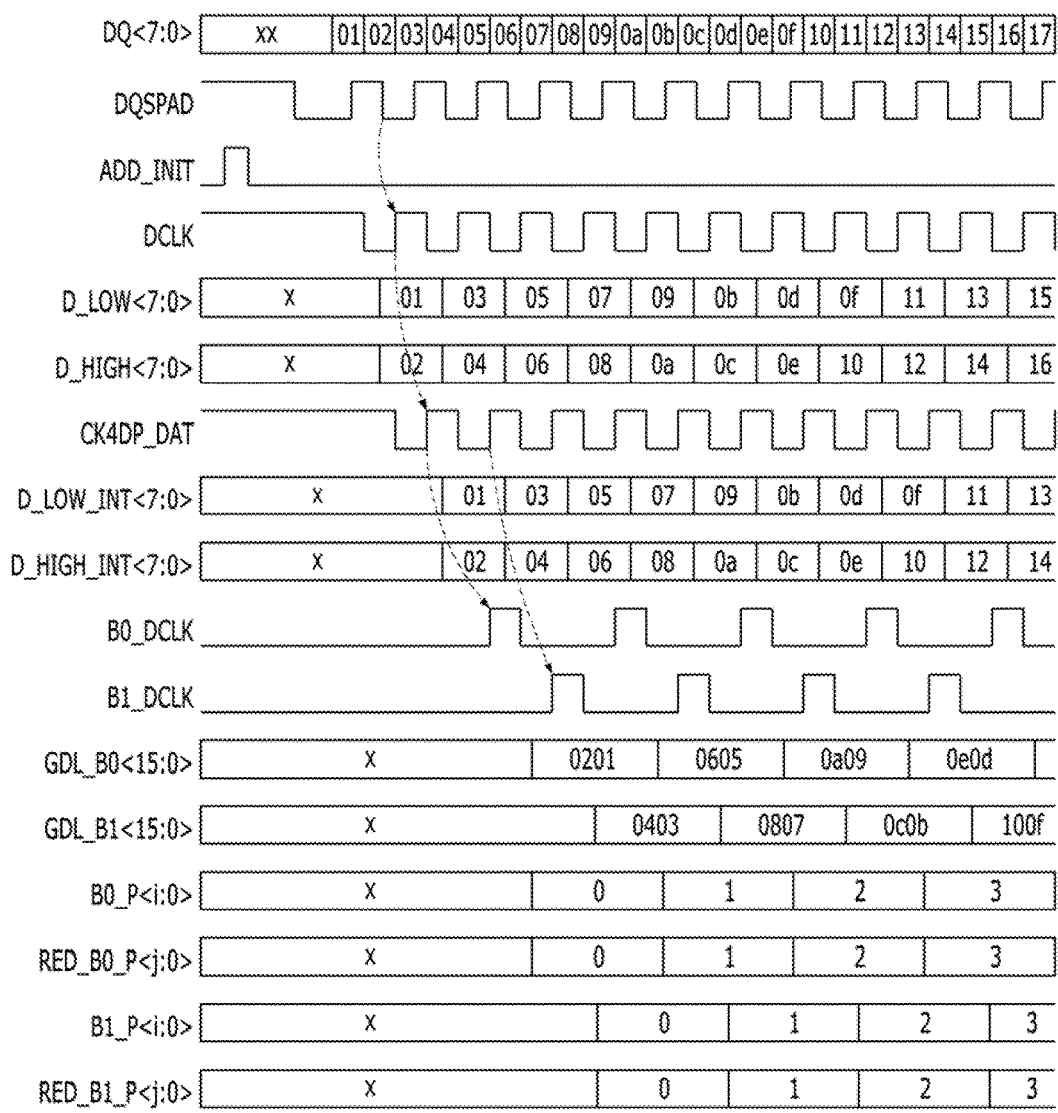
FIG. 9 is a timing diagram illustrating a data control operation of the semiconductor memory device shown in FIG. 5, according to an embodiment of the present invention.

FIG. 9 is a timing diagram illustrating a data control operation of the semiconductor memory device shown in FIG. 5.

Referring to FIG. 9, during a data input operation, a one-type external data DQ<7:0> may be received at a rising edge and a falling edge of the data strobe signal DQSPAD. The data of the external data DQ<7:0> received at a rising edge of the data strobe signal DQSPAD may be sequentially outputted by two bytes as a low data D_LOW<7:0>. The data of the external data DQ<7:0> received at a falling edge of the data strobe signal DQSPAD may be sequentially outputted by two bytes as a high data D_HIGH<7:0>.

For example, the clock signals for controlling the data, an Internal clock signal CK4DP, may be generated in response to the data strobe signal DQSPAD. Also, a data clock signal DCLK may be generated by delaying the internal clock signal CK4DP by a predetermined time, and a data control clock signal CK4DP_DAT may be generated by delaying the data clock signal DCLK by a predetermined time. Herein, it may be seen that when the address control time is decreased, the internal clock signals are enabled quicker than in the conventional technology.

Subsequently, a first bank data clock signal B0_DCLK and a second bank data clock signal B1_DCLK may be generated in response to the data control clock signal CK4DP_DAT. Each of the first bank data clock signal B0_DCLK and the second bank data clock signal B1_DCLK may be generated to have a margin of 2tck for data synchronization.

The data driving unit 562 then may transfer data through first global data lines GDL_B0<15:0> and second global data lines GDL_B1<15:0> in response to the first bank data clock signal B0_DCLK and the second bank data clock signal B1_DCLK having the margin of 2tck.

According to the embodiments of the present invention, the time taken for controlling addresses is decreased, which may reduce the time taken for a data input operation. Therefore, since the delay amount used for controlling addresses, clocks and data is reduced, it is also possible to reduce current consumption, chip size, and changes in process, voltage and temperature (PVT).

While the present invention has been described with respect to specific embodiments, it will be apparent to those skilled in the art that various changes and modifications may be made without departing from the spirit and scope of the invention as defined in the following claims.

What is claimed is:

1. An address generation circuit, comprising:
   a first address control clock generation unit suitable for generating a first address control clock signal in response to an internal clock signal;
   a second address control clock generation unit suitable for generating a second address control clock signal in response to one of an address initialization signal and the first address control clock signal;
   an address counting unit suitable for counting the second address control clock signal and generating a counting address; and
   a repair control unit suitable for latching the counting address in response to the second address control clock signal, comparing the latched counting address with a repair address, and generating a redundancy address based on the comparison result.

2. The address generation circuit of claim 1, wherein the second address control clock generation unit includes:
   an initialization signal generator suitable for generating the address initialization signal in an initial duration of a data input/output operation; and
   a second address control clock generator suitable for generating the second address control clock signal when the address initialization signal or the first address control clock signal is enabled.

3. The address generation circuit of claim 2, wherein the initial duration of the data input/output operation is a duration where the internal clock signal does not toggle.

4. The address generation circuit of claim 1, wherein the repair control unit includes:
   an address latch suitable for latching the counting address and generating an initial counting address in response to the second address control clock signal; and
   a redundancy address generator suitable for comparing the latched counting address with the repair address and generating the redundancy address based on the comparison result.

5. The address generation circuit of claim 4, wherein the address counting unit performs a counting operation and generates the counting address, and the repair control unit generates the redundancy address in response to the initial counting address.

6. The address generation circuit of claim 4, wherein the repair control unit further includes:
   an address delayer suitable for generating a normal address by delaying the initial counting address by a predetermined time;
   a redundancy address latch suitable for latching the redundancy address in response to a bank clock control signal; and
   a normal address latch suitable for latching the normal address in response to the bank clock control signal.

7. The address generation circuit of claim 1, wherein the internal clock signal is generated in response to a data strobe signal.

8. A semiconductor memory device, comprising:
   a memory cell array including a plurality of memory banks;

a clock controller suitable for generating a plurality of clock signals by delaying an internal data strobe signal;

an address controller suitable for generating a first address control clock signal and a second address control clock signal in response to an internal clock signal among the plurality of the clock signals, generating a counting address by counting the second address control clock signal, performing a repair operation in response to the counting address and the second address control clock signal so as to generate a redundancy address; and a data controller suitable for receiving a data from the memory cell array or transferring a data to the memory cell array at a moment when the redundancy address is transferred to the memory cell array in response to a data clock signal among the plurality of the clock signals, wherein the address controller also performs a repair operation together by using the counting address that is generated from a present counting operation and a previous counting operation.

9. The semiconductor memory device of claim 8, further comprising:

first and second page buffers corresponding to the first and second memory banks, respectively, suitable for reading and storing data out of the first and second memory banks; and an input/output (IO) pad suitable for receiving a data strobe signal and an external data and outputting the internal data strobe signal and an internal data.

10. The semiconductor memory device of claim 9, wherein the clock controller includes:

an input data clock generation unit suitable for generating the internal clock signal and the data clock signal in response to the internal data strobe signal;

a bank control clock generation unit suitable for generating the first and second bank control clock signals which correspond to the plurality of the memory banks, respectively, in response to the internal clock signal;

a first clock control unit suitable for generating a first page buffer selection signal for selecting the first page buffer in response to the first bank control clock signal; and a second clock control unit suitable for generating a second page buffer selection signal for selecting the second page buffer in response to the second bank control clock signal.

11. The semiconductor memory device of claim 10, wherein the address controller includes:

a first address control clock generation unit suitable for generating the first address control clock signal corresponding to the first and second memory banks in response to the internal clock signal;

a second address control clock generation unit suitable for generating the second address control clock signal corresponding to the first and second memory banks in response to one of an address initialization signal and the first address control clock signal;

an address counting unit suitable for counting the second address control clock signal and generating a counting address corresponding to the first and second memory banks; and first and second repair control units suitable for latching the counting address corresponding to the first and second memory banks in response to the second address control clock signal, comparing the latched counting address with a repair target address, and generating the redundancy address based on the comparison result.

12. The semiconductor memory device of claim 11, wherein the second address control clock generation unit includes:

an initialization signal generator suitable for generating the address initialization signal in an initial duration of a data input/output operation; and a second address control clock generator suitable for generating the second address control clock signal when the address initialization signal or the first address control clock signal is enabled.

13. The semiconductor memory device of claim 12, wherein the initial duration of the data input/output operation is a duration where the internal clock signal does not toggle.

14. The semiconductor memory device of claim 11, wherein each of the first and second repair control units includes:

an address latch suitable for latching the counting address and generating an initial counting address in response to the second address control clock signal corresponding to the corresponding memory bank; and a redundancy address generator suitable for comparing the latched counting address with the repair address and generating the redundancy address based on the comparison result.

15. The semiconductor memory device of claim 14, wherein the address counting unit performs a counting operation and generates the counting address, and the first and second repair control units generate the redundancy address in response to the initial counting address.

16. The semiconductor memory device of claim 14, wherein each of the first and second repair control units further includes:

an address delayer suitable for generating a normal address by delaying the initial counting address by a predetermined time;

a redundancy address latch suitable for latching the redundancy address in response to a bank clock control signal; and a normal address latch suitable for latching the normal address in response to the bank clock control signal.

17. The semiconductor memory device of claim 10, wherein the bank control clock generation unit generates a data control clock signal by delaying the data clock signal by a predetermined time, and generates first and second bank data clock signals in response to the data control clock signal.

18. The semiconductor memory device of claim 17, wherein the data controller includes:

a data synchronization unit suitable for generating the data control clock signal by delaying the data clock signal by a predetermined time and synchronizing the internal data in response to the data control clock signal; and a data driving unit suitable for transferring a data transferred through the data synchronization unit to first and second global data lines in response to the first and second bank data clock signals.

* * * * *